United States Patent
Yang et al.

(10) Patent No.: US 12,284,863 B2
(45) Date of Patent: Apr. 22, 2025

(54) DISPLAY MODULE AND MANUFACTURING METHOD THEREFOR, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Haotian Yang, Beijing (CN); Fuzheng Xie, Beijing (CN); Xiaoxia Liu, Beijing (CN); Kang Wang, Beijing (CN); Junhui Yang, Beijing (CN); Jiaxiang Zhang, Beijing (CN); Yiming Wang, Beijing (CN); Zhenhua Zhang, Beijing (CN); Renzhe Xu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 276 days.

(21) Appl. No.: 17/915,636

(22) PCT Filed: Aug. 5, 2021

(86) PCT No.: PCT/CN2021/110767
§ 371 (c)(1),
(2) Date: Sep. 29, 2022

(87) PCT Pub. No.: WO2022/057492
PCT Pub. Date: Mar. 24, 2022

(65) Prior Publication Data
US 2023/0112365 A1    Apr. 13, 2023

(30) Foreign Application Priority Data
Sep. 18, 2020   (CN) .......................... 202022058224.1

(51) Int. Cl.
*G06V 40/13*    (2022.01)
*H05K 1/02*    (2006.01)
(Continued)

(52) U.S. Cl.
CPC ......... *H10K 50/84* (2023.02); *G06V 40/1318* (2022.01); *H05K 1/0218* (2013.01);
(Continued)

(58) Field of Classification Search
CPC .... H10K 50/84; H10K 71/00; G06V 40/1318; H05K 1/0218
(Continued)

(56) References Cited

U.S. PATENT DOCUMENTS

2011/0028017 A1*  2/2011  Chuo ..................... H05K 1/117
                                                                       439/329
2018/0121703 A1   5/2018  Jung et al.
(Continued)

FOREIGN PATENT DOCUMENTS

CN    207115247 U  *  3/2018  ........... A61B 5/1172
CN    108549499 A     9/2018
(Continued)

OTHER PUBLICATIONS

PCT International Search Report and Written Opinion (w/ English Translations) for corresponding PCT Application No. PCT/CN2021/110767, mailed Oct. 26, 2021, 15 pages.

*Primary Examiner* — Andargie M Aychillhum
(74) *Attorney, Agent, or Firm* — Dority & Manning, P.A.

(57) ABSTRACT

A display module includes: a display panel, which has a fingerprint identification region; a first protective layer disposed on a back surface of the display panel, the back surface being a surface of the display panel opposite to a display surface of the display panel, and the first protective layer being provided therein with a first opening for expos-
(Continued)

ing the fingerprint identification region; and a metal protective layer disposed on a surface of the first protective layer away from the display panel, the metal protective layer being provided therein with a second opening, the second opening exposing the first opening, and an orthographic projection of an edge of the second opening on the display panel being located outside an orthographic projection of an edge of the first opening on the display panel.

18 Claims, 5 Drawing Sheets

(51) Int. Cl.
*H10K 50/84* (2023.01)
*H10K 71/00* (2023.01)
*H10K 59/12* (2023.01)

(52) U.S. Cl.
CPC ..... *H10K 71/00* (2023.02); *H05K 2201/0715* (2013.01); *H05K 2201/09063* (2013.01); *H10K 59/12* (2023.02); *H10K 59/1201* (2023.02)

(58) Field of Classification Search
USPC .......................................................... 361/749
See application file for complete search history.

(56) References Cited

U.S. PATENT DOCUMENTS

| | | |
|---|---|---|
| 2018/0260602 A1 | 9/2018 | He et al. |
| 2019/0205600 A1 | 7/2019 | Kim |
| 2019/0326367 A1 | 10/2019 | Jung et al. |
| 2020/0296821 A1* | 9/2020 | Trublowski ............ H05K 1/181 |
| 2021/0042495 A1 | 2/2021 | Song et al. |
| 2022/0314574 A1 | 10/2022 | Qian et al. |

FOREIGN PATENT DOCUMENTS

| | | | | |
|---|---|---|---|---|
| CN | 109065588 A | | 12/2018 | |
| CN | 110400824 A | * | 11/2019 | ........... G06F 3/0412 |
| CN | 212659543 U | | 3/2021 | |

* cited by examiner

DISPLAY MODULE AND MANUFACTURING METHOD THEREFOR, AND DISPLAY DEVICE

CROSS-REFERENCE TO RELATED APPLICATIONS

This application is a national phase entry under 35 USC 371 of International Patent Application No. PCT/CN2021/110767, filed on Aug. 5, 2021, which claims priority to Chinese Patent Application No. 202022058224.1, filed on Sep. 18, 2020, which are incorporated herein by reference in their entirety.

TECHNICAL FIELD

The present disclosure relates to the field of display technologies, and in particular, to a display module and a manufacturing method therefor, and a display device.

BACKGROUND

Organic light-emitting diode (OLED) display devices have excellent properties such as self-luminescence, no need for backlight source, high contrast, small thickness, wide viewing angle, fast reaction speed, applicability to flexible panels, wide use temperature range, and simple structure and manufacturing process.

Commonly used OLED display devices include active-matrix organic light-emitting diode (AMOLED) display devices. At present, with the popularity of AMOLED display devices with narrow bezel and full screen, more and more manufacturers adopt under-screen fingerprint identification to replace rear fingerprint identification or front fingerprint identification, and the under-screen fingerprint identification may achieve good user experience by hiding a fingerprint module.

SUMMARY

In an aspect, a display module is provided. The display module includes a display panel, a first protective layer disposed on a back surface of the display panel, and a metal protective layer disposed on a surface of the first protective layer away from the display panel. The display panel has a fingerprint identification region. The back surface is a surface of the display panel opposite to a display surface of the display panel, and the first protective layer is provided therein with a first opening for exposing the fingerprint identification region. The metal protective layer is provided therein with a second opening, the second opening exposes the first opening, and an orthographic projection of an edge of the second opening on the display panel is located outside an orthographic projection of an edge of the first opening on the display panel.

In some embodiments, a shortest distance from each point in the orthographic projection of the edge of the second opening on the display panel to the orthographic projection of the edge of the first opening on the display panel ranges from 0.2 mm to 0.5 mm, inclusive.

In some embodiments, the second opening and the first opening are substantially same in shape and different in size.

In some embodiments, the first protective layer includes an embossing adhesive layer and a buffer layer that are stacked on the back surface of the display panel in sequence.

In some embodiments, the metal protective layer includes a copper layer.

In some embodiments, the display module further includes a flexible circuit board and an optical fingerprint sensor. The flexible circuit board is disposed on a side of the metal protective layer away from the first protective layer. The flexible circuit board is provided therein with a third opening, and an orthographic projection of an edge of the third opening on the display panel is located inside the orthographic projection of the edge of the second opening on the display panel. The optical fingerprint sensor is disposed on a side of the flexible circuit board away from the metal protective layer. An orthographic projection of the optical fingerprint sensor on the display panel is located inside the orthographic projection of the edge of the third opening on the display panel.

In some embodiments, a shortest distance from each point in the orthographic projection of the edge of the third opening on the display panel to the orthographic projection of the edge of the second opening on the display panel is less than or equal to 1 mm.

In some embodiments, the third opening and the second opening are substantially same in shape and different in size.

In some embodiments, a shortest distance from each point in the orthographic projection of the edge of the third opening on the display panel to the orthographic projection of the optical fingerprint sensor on the display panel is less than or equal to 1 mm.

In some embodiments, the orthographic projection of the optical fingerprint sensor on the display panel is located inside the orthographic projection of the edge of the first opening on the display panel.

In some embodiments, a shortest distance from each point in the orthographic projection of the edge of the first opening on the display panel to the orthographic projection of the optical fingerprint sensor on the display panel is less than or equal to 1 mm.

In some embodiments, the orthographic projection of the edge of the third opening on the display panel and the orthographic projection of the edge of the first opening on the display panel substantially overlap.

In some embodiments, the display module further includes a main control circuit board. The optical fingerprint sensor is disposed on the main control circuit board, and the main control circuit board is connected to the display panel through the flexible circuit board.

In some embodiments, the display module further includes a first electromagnetic shielding film and/or a second electromagnetic shielding film. The first electromagnetic shielding film is disposed on a surface of the flexible circuit board proximate to the metal protective layer, and the first electromagnetic shielding film is provided therein with a fourth opening at a position corresponding to the third opening. The electromagnetic shielding film is disposed on a surface of the flexible circuit board away from the metal protective layer, and the second electromagnetic shielding film is provided therein with a fifth opening at a position corresponding to the third opening.

In some embodiments, the display module further includes a protective cover plate disposed on a surface of the display panel away from the first protective layer.

In another aspect, a display device is provided. The display device includes the display module according to any one of the above embodiments.

In yet another aspect, a manufacturing method for a display module is provided. The manufacturing method includes: providing a display panel, the display panel having a fingerprint identification region; adhering a first protective layer having a first opening onto a back surface of the display panel, the back surface being a surface of the display panel opposite to a display surface of the display panel, and the first opening of the first protective layer exposing the fingerprint identification region; and adhering a metal protective layer having a second opening onto a surface of the first protective layer away from the display panel, the second opening exposing the first opening, and an orthographic projection of an edge of the second opening on the display panel being located outside an orthographic projection of an edge of the first opening on the display panel.

In some embodiments, a shape and a size of the first opening are approximately same as a shape and a size of the fingerprint identification region, respectively.

In some embodiments, the embossing adhesive layer is made of a black embossing adhesive, and the buffer layer is made of foam.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, but are not limitations on actual sizes of products, actual processes of methods and actual timings of signals involved in the embodiments of the present disclosure.

DETAILED DESCRIPTION

Technical solutions in some embodiments of the present disclosure will be described clearly and completely below with reference to the accompanying drawings below. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representation of the above term does not necessarily refer to the same embodiment(s) or examples(s). In addition, the specific features, structures, materials or characteristics may be included in any one or more embodiments or examples in any suitable manner.

Hereinafter, the terms "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

In the description of some embodiments, the term "connected" and derivatives thereof may be used. For example, the term "connected" may be used in the description of some embodiments to indicate that two or more components are in direct physical or electrical contact with each other.

The phrase "A and/or B" includes the following three combinations: only A, only B, and a combination of A and B.

In addition, the phase "based on" used indicates openness and inclusiveness, since a process, step, calculation or other action that is "based on" one or more of the stated conditions or values may, in practice, be based on additional conditions or values exceeding those stated.

As used herein, the term "approximately" or "substantially" includes a stated value and an average value within an acceptable range of deviation of a particular value. The acceptable range of deviation is determined by a person of ordinary skill in the art in view of the measurement in question and error associated with the measurement of a particular quantity (i.e., the limitations of the measurement system).

Exemplary embodiments are described herein with reference to sectional views and/or plan views as idealized exemplary accompanying drawings. In the accompanying drawings, thicknesses of layers and sizes of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown to have a rectangular shape generally has a feature of being curved. Thus, the regions shown in the accompanying drawings are schematic in nature, and their shapes are not intended to show actual shapes of the regions in a device, and are not intended to limit the scope of the exemplary embodiments.

Figure 1A:
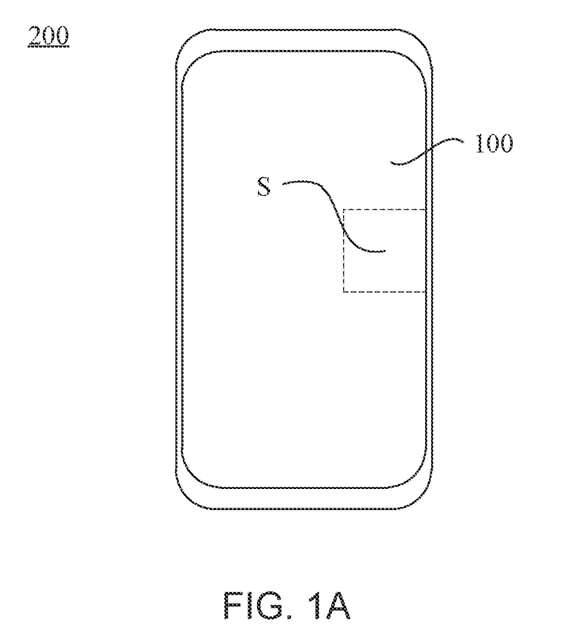
FIG. 1A is a top view of a display device, in accordance with some embodiments.
Figure 1B:
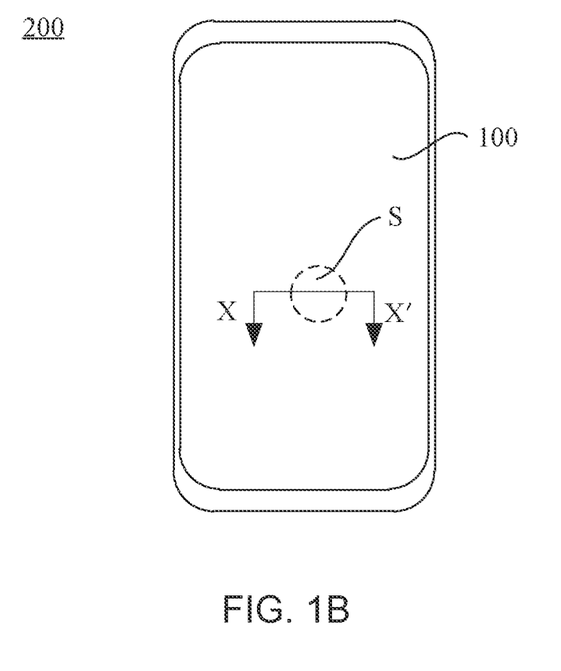
FIG. 1B is a top view of another display device, in accordance with some embodiments.

FIGS. 1A and 1B each show a display device 200 in some embodiments of the present disclosure. As shown in FIGS. 1A and 1B, the display devices 200 each include a display module 100, and a display panel of the display module 100 has a fingerprint identification region S. When a finger is pressed in the fingerprint identification region S, light (e.g., light emitted by the display panel) irradiates a fingerprint (i.e., textures of the finger), and then the light is reflected by the fingerprint to an optical fingerprint sensor under the display panel. As a result, a fingerprint image is generated, so that the display device 200 is unlocked. Here, it will be noted that, the fingerprint identification region S needs to enable the light reflected by the fingerprint to pass through and then be directed to the optical fingerprint sensor. A position and a shape of the fingerprint identification region S may be arranged in various ways. For example, the fingerprint identification region S may be in a substantially rectangular shape (e.g., a rectangular shape, or a square shape shown in FIG. 1A), or may be in a substantially circular shape (as shown in FIG. 1B), or may be in a substantially rounded rectangular shape. The term "substantially" is meant to include the stated shape and shapes that are generally similar to the stated shape. For example, for the "substantially circular shape", it may be a circular shape or a shape similar to the circular shape as a whole. At least part of a border of the shape that is similar to the circular shape is allowed to be different from at least part of a border of the circular shape. That is, the at least part of the border of the shape that is similar to the circular shape is allowed to be non-arched. For example, the at least part of the border of the shape that is similar to the circular shape may be saw-toothed. Similarly, it can be understood that, the "substantially rectangular shape" and "substantially rounded rectangular shape" are not limited to a standard rectangular shape and a standard rounded rectangular shape, respectively.

As another example, the fingerprint identification region S may be located in an edge region of the display panel in the display module 100 (as shown in FIG. 1A), or may be located in a middle region of the display panel in the display module 100 (as shown in FIG. 1B).

The display device 200 may be an organic light-emitting diode (OLED) display device, such as an active-matrix organic light-emitting diode (AMOLED) display device. In addition, the display device 200 may be any component with a display function, such as a television, a digital camera, a mobile phone, a watch, a tablet computer, a notebook computer, or a navigator.

Figure 2A:
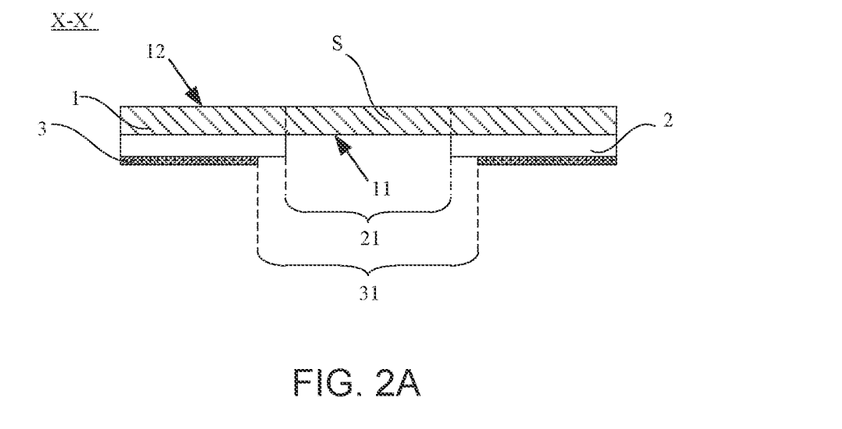
FIG. 2A is a sectional view of a display module in the display device in FIG. 1B at X-X'.

Some embodiments of the present disclosure provide the display module 100 applied to the display device 200. As shown in FIG. 2A, the display module 100 includes a display panel 1, a first protective layer 2 and a metal protective layer 3.

The display panel 1 has the fingerprint identification region S. The display panel 1 may be an OLED display panel (e.g., an AMOLED display panel).

The first protective layer 2 is disposed on a back surface 11 of the display panel 1, and the back surface 11 of the display panel 1 is a surface of the display panel 1 opposite to a display surface 12 of the display panel 1 (for example, the display surface 12 may display text, images or videos). The first protective layer 2 is provided therein with a first opening 21 for exposing the fingerprint identification region S. For example, a shape and a size of the first opening 21 may be the same or approximately the same as the shape and a size of the fingerprint identification region S, respectively, so that more light reflected by the fingerprint may pass through the first opening 21.

The metal protective layer 3 is located on a surface of the first protective layer 2 away from the display panel 1, and the metal protective layer 3 is provided therein with a second opening 31. The second opening 31 exposes the first opening 21. An orthographic projection of an edge of the second opening 31 on the display panel 1 is located outside an orthographic projection of an edge of the first opening 21 on the display panel 1. In this case, the orthographic projection of the edge of the second opening 31 on the display panel 1 and the orthographic projection of the edge of the first opening 21 on the display panel 1 may not be in contact at all, or may be partially in contact. It can be understood that, an opening area of the second opening 31 should be larger than an opening area of the first opening 21.

Figure 2B:
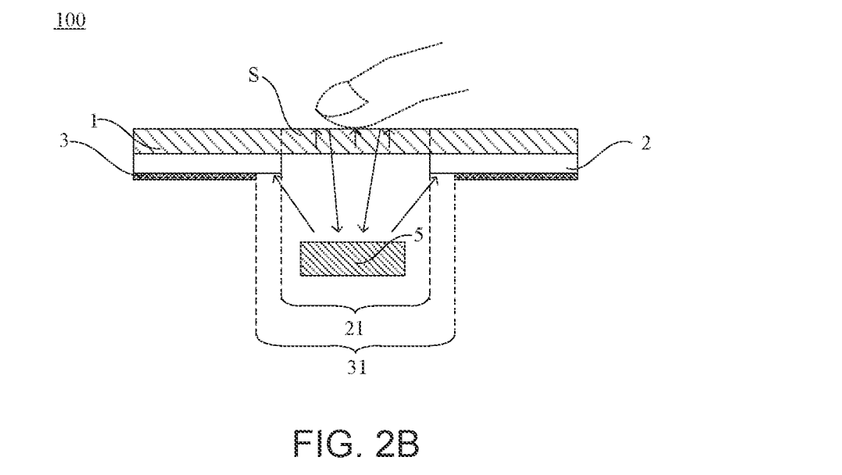
FIG. 2B is a sectional view of another display module, in accordance with some embodiments.

With this arrangement, after the display module 100 is fitted with the optical fingerprint sensor (for example, the optical fingerprint sensor 5 may be fitted with the display panel 1, the first protective layer 2 and the metal protective layer 3 in the manner shown in FIG. 2B, that is, the optical fingerprint sensor 5 may be disposed on a side of the metal protective layer 3 away from the first protective layer 2, and the optical fingerprint sensor 5 directly faces the fingerprint identification region S of the display panel 1), the light reflected by the fingerprint is not easily directed to the metal protective layer 3 after being directed to the optical fingerprint sensor 5 through the first opening 21 and then being reflected by the optical fingerprint sensor 5. Consequently, a situation where the metal protective layer 3 reflects the light back to the optical fingerprint sensor 5 is not easy to occur, and optical interference to the optical fingerprint sensor 5 caused by the metal protective layer 3 reflecting the light may be ameliorated. As a result, a fingerprint identification efficiency and a fingerprint identification accuracy of the display module 100 may be improved.

Here, it is worth noting that, compared with a case where both the opening area of the first opening 21 in the first protective layer 2 and the opening area of the second opening 31 in the metal protective layer 3 are increased to a same size, in the embodiments, by arranging the first opening 21 for exposing the fingerprint identification region S, and arranging the orthographic projection of the edge of the second opening 31 on the display panel 1 being located outside the orthographic projection of the edge of the first opening 21 on the display panel 1, it may be possible to prevent supporting and protecting effects of the first protective layer 2 and the metal protective layer 3 on the display panel 1 from being reduced due to openings in the first protective layer 2 and the metal protective layer 3 being both large while ameliorating the problem of optical interference to the optical fingerprint sensor 5 caused by the metal protective layer 3 reflecting the light. For example, hardness of the display panel 1 is poor, and in the case where the openings in the first protective layer 2 and the metal protective layer 3 are both large, there is a large height difference at the opening position after the first protective layer 2 and the metal protective layer 3 are adhered to the display panel 1, so that an indentation is easy to appear on the display panel 1. However, the display module 100 provided in the embodiments of the present disclosure may well ameliorate this problem.

The first protective layer 2 is a layer that does not reflect light, so that the light is not reflected by the first protective layer 2 to the optical fingerprint sensor 5 after irradiating the first protective layer 2. Thus, no optical interference is caused to the optical fingerprint sensor 5.

Figure 3:
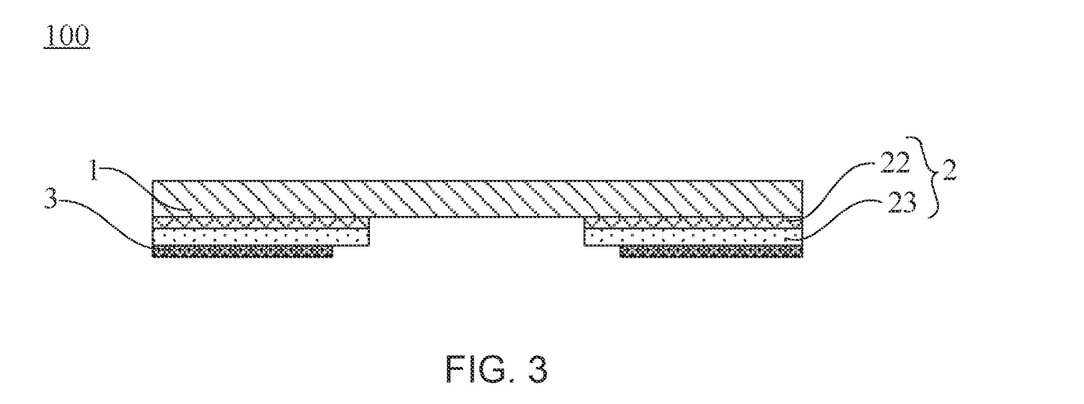
FIG. 3 is a sectional view of yet another display module, in accordance with some embodiments.

As a possible design, as shown in FIG. 3, the first protective layer 2 includes an embossing adhesive layer 22 and a buffer layer 23 that are stacked on the back surface 11 of the display panel 1 in sequence. With this arrangement, the embossing adhesive layer 22 can be more tightly connected with the display panel 1 and the buffer layer 23, so that the embossing adhesive layer 22 and the buffer layer 23 can be well fixed on the display panel 1, and good buffering and shading effects can be achieved.

The embossing adhesive layer 22 may be made of a black embossing adhesive, and the buffer layer 23 may be made of foam. The foam is light in weight and has elasticity, and can protect the display panel 1 and circuit structures under the display panel 1. For example, in a case where the display panel 1 is subjected to a large force, since the back surface of the display panel 1 is not in direct contact with a rigid component, the display panel 1 is not easily damaged, and the circuit structures under the display panel 1 are not damaged due to pressing of the display panel 1.

Here, it can be understood that, openings in the embossing adhesive layer 22 and the buffer layer 23 may together constitute the first opening 21. In some examples, an orthographic projection of an edge of an opening in the embossing adhesive layer 22 on the display panel 1 overlaps an orthographic projection of an edge of an opening in the buffer layer 23 on the display panel 1. Of course, in some other examples, the two orthographic projections may not overlap, as long as it is ensured that the orthographic projection of the edge of the second opening 31 in the metal protective layer 3 on the display panel 1 is located outside the orthographic projection of the edge of the opening in the embossing adhesive layer 22 on the display panel 1, and the orthographic projection of the edge of the second opening 31 in the metal protective layer 3 on the display panel 1 is located outside the orthographic projection of the edge of the opening in the buffer layer 23 on the display panel 1. The embodiments of the present disclosure are not limited thereto.

As a possible design, the metal protective layer 3 includes a copper layer. A material of the copper layer may be copper or a copper alloy. With this arrangement, a heat dissipation effect can be improved, and heat generated by the display panel 1 may be dissipated quickly. Moreover, other stray light (such as external ambient light) can be prevented from directly irradiating the optical fingerprint sensor 5, thereby improving the fingerprint identification efficiency and the fingerprint identification accuracy of the display module 100.

Figure 4A:
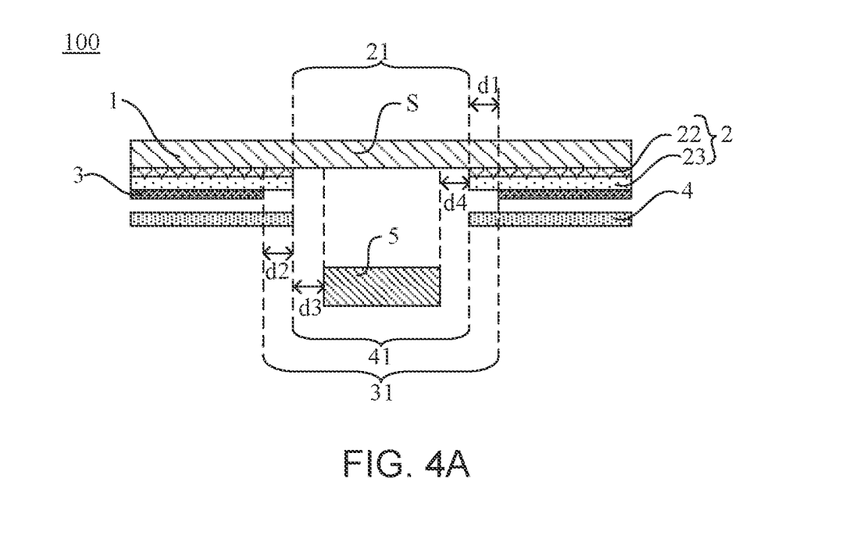
FIG. 4A is a sectional view of yet another display module, in accordance with some embodiments.

In some embodiments, as shown in FIG. 4A, the display module 100 further includes a flexible circuit board 4 and the optical fingerprint sensor 5.

The flexible circuit board 4 is disposed on the side of the metal protective layer 3 away from the first protective layer 2, and the flexible circuit board 4 is provided therein with a third opening 41. An orthographic projection of an edge of the third opening 41 on the display panel 1 is located inside the orthographic projection of the edge of the second opening 31 on the display panel 1. In this case, the orthographic projection of the edge of the third opening 41 on the display panel 1 and the orthographic projection of the edge of the second opening 31 on the display panel 1 may be not in contact at all, or may be partially in contact. It can be understood that, the opening area of the second opening 31 should be larger than an opening area of the third opening 41.

The optical fingerprint sensor 5 is disposed on a side of the flexible circuit board 4 away from the metal protective layer 3. An orthographic projection of the optical fingerprint sensor 5 on the display panel 1 is located inside the orthographic projection of the edge of the third opening 41 on the display panel 1. In this case, the orthographic projection of the optical fingerprint sensor 5 on the display panel 1 and the orthographic projection of the edge of the third opening 41 on the display panel 1 may be not in contact at all, or may be partially in contact. It can be understood that, the opening area of the third opening 41 should be larger than an area of the orthographic projection of the optical fingerprint sensor 5 on the display panel 1.

The optical fingerprint sensor 5 achieves fingerprint detection and identification by using the light reflected back to the display module 100 by the fingerprint above the display module 100, and the flexible circuit board 4 is located between the optical fingerprint sensor 5 and the display panel 1, the flexible circuit board 4 being opaque. Therefore, by providing the third opening 41 in the flexible circuit board 4, the light reflected back to the display module 100 can irradiate the optical fingerprint sensor 5.

Based on this, by arranging the orthographic projection of the edge of the third opening 41 on the display panel 1 to be located inside the orthographic projection of the edge of the second opening 31 on the display panel 1, and by arranging the orthographic projection of the optical fingerprint sensor 5 on the display panel 1 to be located inside the orthographic projection of the edge of the third opening 41 on the display panel 1, the light reflected back to the display module 100 by the fingerprint can pass through the third opening 41 in the flexible circuit board 4 and then irradiate the optical fingerprint sensor 5, and a situation where only part of positions on the optical fingerprint sensor 5 can receive the light reflected by the fingerprint, or the optical fingerprint sensor 5 cannot receive the light reflected by the fingerprint at all is not easy to occur; therefore, the optical fingerprint sensor 5 can receive more light, and in turn, the fingerprint identification efficiency and the fingerprint identification accuracy of the optical fingerprint sensor 5 is improved. In addition, the light reflected by the optical fingerprint sensor 5 may be blocked by using the flexible circuit board 4 to prevent the light reflected by the optical fingerprint sensor 5 from irradiating the metal protective layer 3, so that a situation where the metal protective layer 3 reflects the light reflected by the optical fingerprint sensor 5 back to the optical fingerprint sensor 5 is not easy to occur (that is, it is not easy to cause optical interference to the optical fingerprint sensor 5).

Figure 4B:
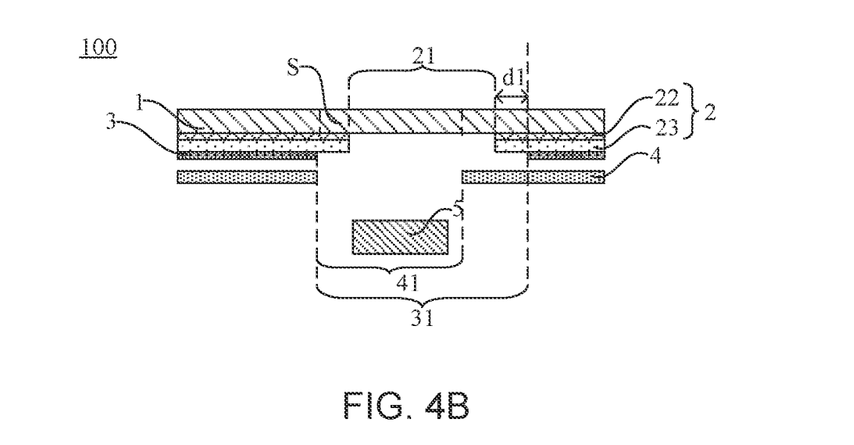
FIG. 4B is a sectional view of yet another display module, in accordance with some embodiments.

It is worth noting that, in a case where the first protective layer 2 and the metal protective layer 3 are adhered to the display panel, an adhesion deviation is easy to occur. That is, as shown in FIG. 4B, it is easy to make part of the orthographic projection of the edge of the first opening 21 on the display panel 1 fall within the fingerprint identification region S. In this case, the third opening 41 will expose part of the first protective layer 2. However, in the embodiments of the present disclosure, the orthographic projection of the edge of the second opening 31 on the display panel 1 is located outside the orthographic projection of the edge of the first opening 21 on the display panel 1, so that even if there is the adhesion deviation after the first protective layer 2 and the metal protective layer 3 are adhered to the display panel 1, the third opening 41 does not easily expose the metal protective layer 3 (as shown in FIG. 4B). Therefore, it may well prevent the optical fingerprint sensor 5 from reflecting the light to the metal protective layer 3, thereby preventing the light reflected by the metal protective layer 3 from causing optical interference to the optical fingerprint sensor 5.

As a possible design, referring to FIGS. 4A and 4B, a shortest distance d1 from each point in the orthographic projection of the edge of the second opening 31 on the display panel 1 to the orthographic projection of the edge of the first opening 21 on the display panel 1 ranges from 0.2 mm to 0.5 mm, inclusive. For example, d1 may be 0.2 mm, 0.3 mm, or 0.5 mm, etc. Here, the second opening 31 and the first opening 21 may have a substantially same shape or different shapes. The description that "the second opening 31 and the first opening 21 may have a substantially same shape" means that the two may have an exactly same shape, or one of the two may have a shape that is similar to a shape of the other as a whole.

With this arrangement, a distance between the orthographic projection of the edge of the second opening 31 on the display panel 1 and the orthographic projection of the edge of the first opening 21 on the display panel 1 may be made large, so that in the case of deviation in the adhesion of the first protective layer 2 and the metal protective layer 3, the light reflected by the optical fingerprint sensor 5 is not easy to irradiate the metal protective layer 3, and the situation where the metal protective layer 3 reflects the light back to the optical fingerprint sensor 5 is not easy to occur, thereby ameliorating the optical interference to the optical fingerprint sensor 5. In addition, the area of the second opening 31 may be made relatively small (that is, an area of an orthographic projection of the metal protective layer 3 on the display panel 1 may be made relatively large), so that good support and protection may be provided for the display panel 1, and the heat generated by the display panel 1 may be dissipated quickly.

Based on this, for example, as shown in FIG. 4A, a shortest distance d2 from each point in the orthographic projection of the edge of the third opening 41 on the display panel 1 to the orthographic projection of the edge of the second opening 31 on the display panel 1 is less than or equal to 1 mm. Here, the third opening 41 and the second opening 31 may have a substantially same shape or different shapes. The description that "the third opening 41 and the second opening 31 may have a substantially same shape" means that the two may have an exactly same shape, or one of the two may have a shape that is similar to a shape of the other as a whole.

With this arrangement, the third opening 41 does not directly expose the metal protective layer 3. Thus, the light reflected by the optical fingerprint sensor 5 may be blocked by using the flexible circuit board 4. As a result, the light reflected by the optical fingerprint sensor 5 is not directly directed to the metal protective layer 3, which ameliorates the problem of optical interference to the optical fingerprint sensor 5 caused by the metal protective layer 3 reflecting the light to the optical fingerprint sensor 5, and improves the fingerprint identification efficiency and the fingerprint identification accuracy of the optical fingerprint sensor 5.

For example, as shown in FIG. 4A, a shortest distance d3 from each point in the orthographic projection of the edge of the third opening 41 on the display panel 1 to the orthographic projection of the optical fingerprint sensor 5 on the display panel 1 is less than or equal to 1 mm.

With this arrangement, the flexible circuit board 4 does not block the optical fingerprint sensor 5 (that is, the light reflected by the fingerprint can still reach the optical fingerprint sensor 5 smoothly), so that a portion of the optical fingerprint sensor 5 facing the display panel 1 can receive the light reflected by the fingerprint, and a failure of fingerprint identification caused by an incomplete fingerprint image received by the optical fingerprint sensor 5 may be avoided. In addition, no excessive stray light is directed to the optical fingerprint sensor 5 due to an excessively large third opening 41 in the flexible circuit board 4 (that is, unnecessary surrounding light (e.g., the light reflected by the metal protective layer 3) may be blocked by using the flexible circuit board 4), thereby helping improve the fingerprint identification efficiency and the fingerprint identification accuracy of the optical fingerprint sensor 5.

Figure 5:
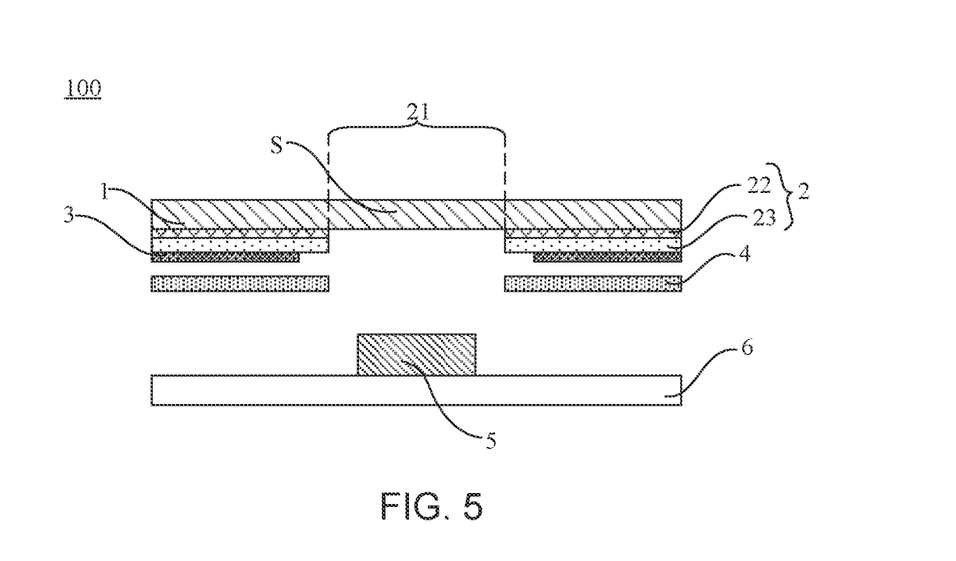
FIG. 5 is a sectional view of yet another display module, in accordance with some embodiments.

In some embodiments, as shown in FIG. 5, the orthographic projection of the optical fingerprint sensor 5 on the display panel 1 is located inside the orthographic projection of the edge of the first opening 21 on the display panel 1. In this case, the orthographic projection of the optical fingerprint sensor 5 on the display panel 1 and the orthographic projection of the edge of the first opening 21 on the display panel 1 may be not in contact at all, or may be partially in contact. It can be understood that, an area of the orthographic projection of the optical fingerprint sensor 5 on the display panel 1 should be smaller than the opening area of the first opening 21.

With this arrangement, the surface of the optical fingerprint sensor 5 facing the display panel 1 is not blocked by the first protective layer 2, so that the surface of the optical fingerprint sensor 5 facing the display panel 1 can receive the light reflected by the fingerprint. As a result, a situation where the light reflected by the fingerprint cannot be directed to the surface of the optical fingerprint sensor 5 facing the display panel 1 due to the blocking of the first protective layer 2 is not easy to occur, thereby helping improve the fingerprint identification accuracy.

For example, as shown in FIG. 4A, a shortest distance d4 from each point in the orthographic projection of the edge of the first opening 21 on the display panel 1 to the orthographic projection of the optical fingerprint sensor 5 on the display panel 1 is less than or equal to 1 mm.

With this arrangement, the first protective layer 2 does not block the optical fingerprint sensor 5 (that is, the light reflected by the fingerprint can reach the optical fingerprint sensor 5 smoothly), so that the surface of the optical fingerprint sensor 5 facing the display panel 1 can receive the light reflected by the fingerprint, and the failure of fingerprint identification caused by the incomplete fingerprint image received by the optical fingerprint sensor 5 may be avoided. In addition, no excessive stray light is directed to the optical fingerprint sensor 5 due to an excessively large first opening 21 in the first protective layer 2 (that is, unnecessary surrounding light (e.g., the external ambient light) may be blocked by using the first protective layer 2), thereby helping improve the fingerprint identification efficiency and the fingerprint identification accuracy of the optical fingerprint sensor 5.

In some embodiments, as shown in FIG. 4A, the orthographic projection of the edge of the third opening 41 on the display panel 1 and the orthographic projection of the edge of the first opening 21 on the display panel 1 substantially overlap (here, "substantially overlap" means that the two orthographic projections completely overlap, or there may be a reasonable deviation between the two orthographic projections due to manufacturing errors (for example, the deviation may be less than 0.5 mm)). With this arrangement, the light emitted from the display panel 1 and then reflected by the fingerprint of a user is easy to pass through the third opening 41 directly after passing through the first opening 21 and the second opening 31, which avoids that light passing through the first opening 21 cannot irradiate the optical fingerprint sensor 5 due to blocking of the flexible circuit board 4. As a result, an amount of the light irradiating the optical fingerprint sensor 5 is increased, and the identification efficiency and the identification accuracy of the optical fingerprint sensor 5 are effectively increased.

In some embodiments, as shown in FIG. 5, the display module 100 further includes a main control circuit board 6, on which the optical fingerprint sensor 5 is disposed, and the main control circuit board 6 is connected to the display panel 1 through the flexible circuit board 4. With this arrangement, it is possible not only to control the display panel 1 to display an image through the main control circuit board 6 and the flexible circuit board 4, but also to determine whether to unlock the display device according to fingerprint information identified by the optical fingerprint sensor 5 when the fingerprint of the user is pressed on the fingerprint identification region S. For example, the display device may be unlocked in a case where verification of the fingerprint information is correct, and the display device is kept in a locked state in a case where the verification of the fingerprint information fails.

Figure 6:
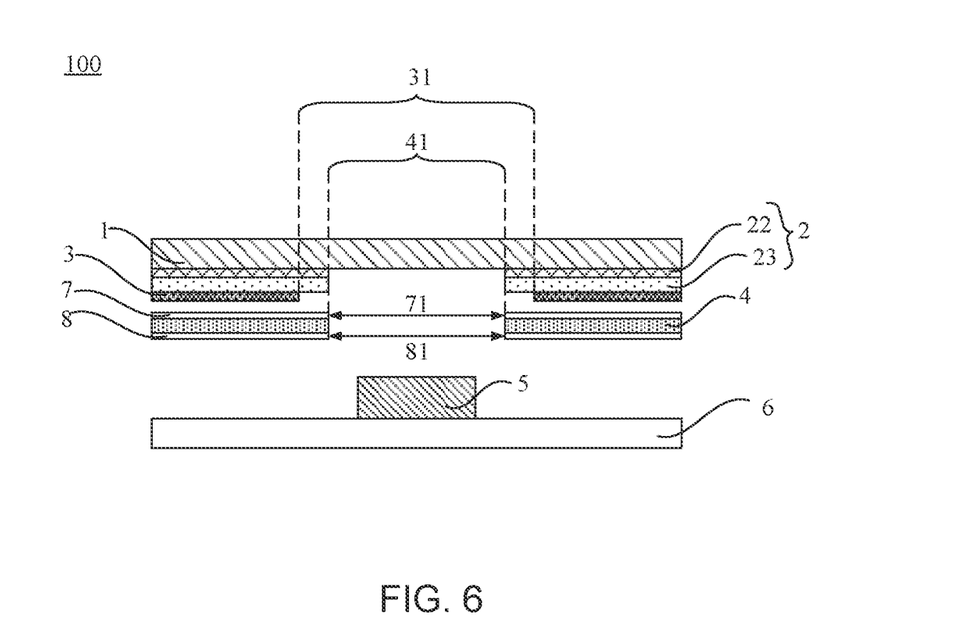
FIG. 6 is a sectional view of yet another display module, in accordance with some embodiments.

In some embodiments of the present disclosure, as shown in FIG. 6, the display module 100 further includes a first electromagnetic shielding film 7, which is disposed on a surface of the flexible circuit board 4 proximate to the metal protective layer 3. The first electromagnetic shielding layer 4 is provided with therein a fourth opening 71 at a position corresponding to the third opening 41. Through the fourth opening 71, the light may propagate from the second opening 31 to the third opening 41.

In some embodiments of the present disclosure, as shown in FIG. 6, the display module 100 further includes a second electromagnetic shielding film 8, which is disposed on a surface of the flexible circuit board 4 away from the metal protective layer 3. The second electromagnetic shielding film 8 is provided therein with a fifth opening 81 at a position corresponding to the third opening 41. Through the fifth opening 81, the light reflected by the fingerprint back to the display module 100 may be directed to the optical fingerprint sensor 5 after passing through the third opening 41.

It will be noted that, the display module 100 may include only the first electromagnetic shielding film 7 or only the second electromagnetic shielding film 8, or may include both the first electromagnetic shielding film 7 and the second electromagnetic shielding film 8. In this solution, by providing the electromagnetic shielding film(s), circuits in the flexible circuit board 4 may be prevented from being subjected to electromagnetic interference, and in turn, a display effect is not easily affected.

Figure 7:
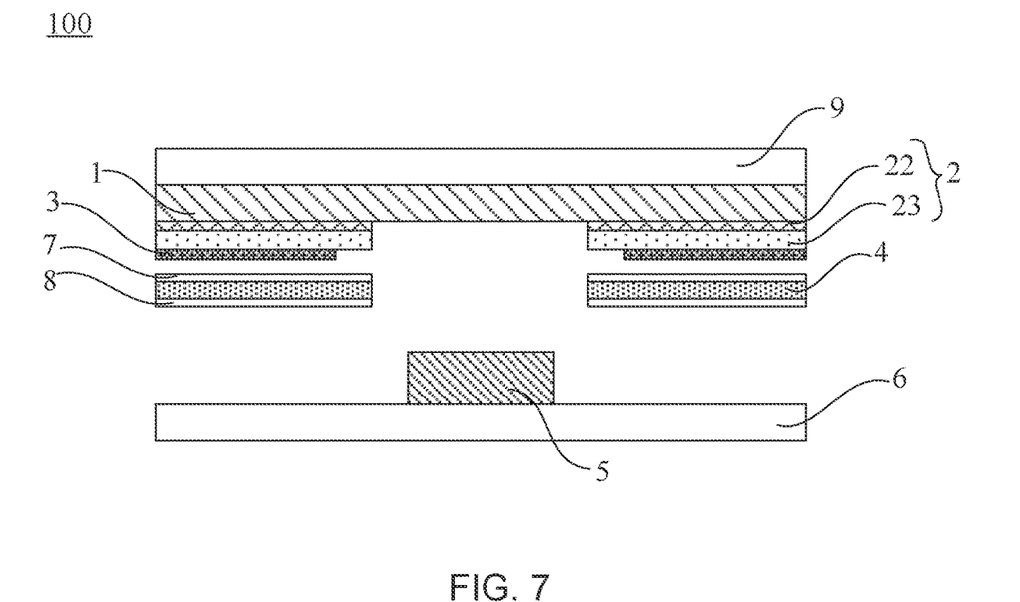
FIG. 7 is a sectional view of yet another display module, in accordance with some embodiments.

In some embodiments, as shown in FIG. 7, the display module 100 further includes a protective cover plate 9, which is disposed on a surface of the display panel 1 away from the first protective layer 2. The protective cover plate 9 is used for protecting the display panel 1, preventing the display panel 1 from being deformed due to influence of an external force, and preventing the circuit structures in the display module 100 from being adversely affected due to moisture entering the display module 100.

In addition, it will be noted that, referring to FIGS. 1A and 1B, since the display device 200 provided in some embodiments of the present disclosure includes the display module 100 described in any one of the above embodiments, technical effects that can be achieved by the display device 200 are the same as technical effects that can be achieved by the display module 100, and details will not be repeated here.

Figure 8:
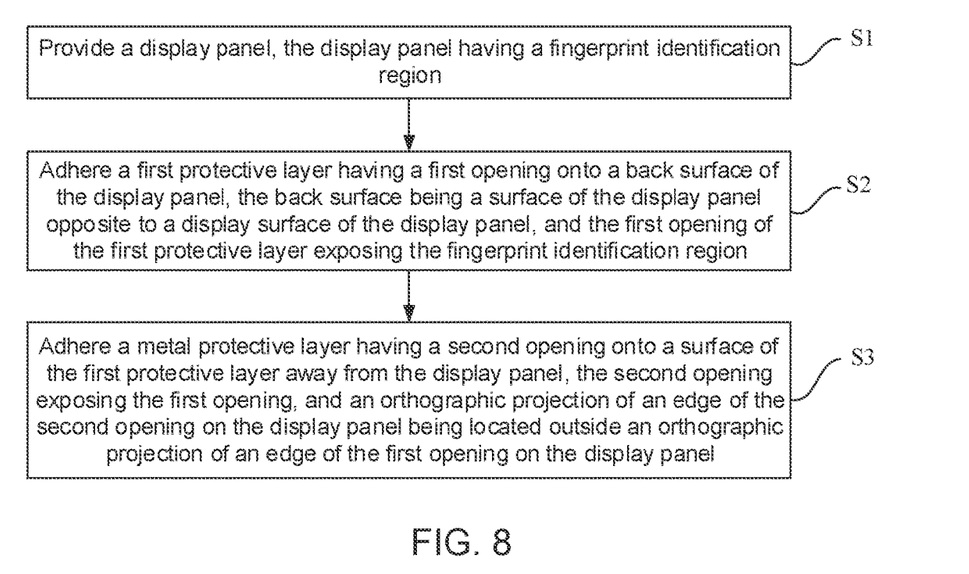
FIG. 8 is a flow diagram of a manufacturing method for a display module, in accordance with some embodiments.

Based on the above display module 100, as shown in FIG. 8, some embodiments of the present disclosure provide a manufacturing method for the display module 100. The manufacturing method includes:

in S1, providing the display panel, the display panel having the fingerprint identification region;

in S2, adhering the first protective layer having the first opening onto the back surface of the display panel, the back surface being the surface of the display panel opposite to the display surface of the display panel, and the first opening of the first protective layer exposing the fingerprint identification region; and in S3, adhering the metal protective layer having the second opening onto the surface of the first protective layer away from the display panel, the second opening exposing the first opening, and the orthographic projection of the edge of the second opening on the display panel being located outside the orthographic projection of the edge of the first opening on the display panel.

It will be noted that, the first protective layer having the first opening may be directly obtained by cutting a first protective layer through a die-cutting process. Similarly, the metal protective layer having the second opening may be directly obtained by cutting a metal protective layer through the die-cutting process.

For the display module 100 obtained by using the manufacturing method for the display module, even if a deviation occurs when the first protective layer 2 is adhered on the display panel 1, since the orthographic projection of the edge of the second opening 31 in the metal protective layer 3 on the display panel 1 is located outside the orthographic projection of the edge of the first opening 21 on the display panel 1, the light reflected by the optical fingerprint sensor 5 corresponding to the fingerprint identification region S is not easy to irradiate the metal protective layer 3, which prevents the metal protective layer 3 from reflecting the light onto the optical fingerprint sensor 5. As a result, it helps improve the fingerprint identification efficiency and the fingerprint identification accuracy of the optical fingerprint sensor 5, and in turn, improves the fingerprint identification efficiency and the fingerprint identification accuracy of the display module 100, and improves user experience.

The foregoing descriptions are merely specific implementations of the present disclosure, but the protection scope of the present disclosure is not limited there. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display module, comprising:
  a display panel having a fingerprint identification region;
  a first protective layer disposed on a back surface of the display panel, wherein the back surface is a surface of the display panel opposite to a display surface of the display panel, and the first protective layer is provided therein with a first opening for exposing the fingerprint identification region;
  a metal protective layer disposed on a surface of the first protective layer away from the display panel, wherein the metal protective layer is provided therein with a second opening, the second opening exposes the first opening, and an orthographic projection of an edge of the second opening on the display panel is located outside an orthographic projection of an edge of the first opening on the display panel;
  a flexible circuit board disposed on a side of the metal protective layer away from the first protective layer, wherein the flexible circuit board is provided therein with a third opening, and an orthographic projection of an edge of the third opening on the display panel is located inside the orthographic projection of the edge of the second opening on the display panel; and
  an optical fingerprint sensor disposed on a side of the flexible circuit board away from the metal protective layer, wherein an orthographic projection of the optical fingerprint sensor on the display panel is located inside the orthographic projection of the edge of the third opening on the display panel.

2. The display module according to claim 1, wherein a shortest distance from each point in the orthographic projection of the edge of the second opening on the display panel to the orthographic projection of the edge of the first opening on the display panel ranges from 0.2 mm to 0.5 mm, inclusive.

3. The display module according to claim 1, wherein the second opening and the first opening are substantially same in shape and different in size.

4. The display module according to claim 1, wherein the first protective layer includes an embossing adhesive layer and a buffer layer that are stacked on the back surface of the display panel in sequence.

5. The display module according to claim 4, wherein the embossing adhesive layer is made of a black embossing adhesive, and the buffer layer is made of foam.

6. The display module according to claim 1, wherein the metal protective layer includes a copper layer.

7. The display module according to claim 1, wherein a shortest distance from each point in the orthographic projection of the edge of the third opening on the display panel to the orthographic projection of the edge of the second opening on the display panel is less than or equal to 1 mm.

8. The display module according to claim 1, wherein the third opening and the second opening are substantially same in shape and different in size.

9. The display module according to claim 1, wherein a shortest distance from each point in the orthographic projection of the edge of the third opening on the display panel to the orthographic projection of the optical fingerprint sensor on the display panel is less than or equal to 1 mm.

10. The display module according to claim 1, wherein the orthographic projection of the optical fingerprint sensor on the display panel is located inside the orthographic projection of the edge of the first opening on the display panel.

11. The display module according to claim 10, wherein a shortest distance from each point in the orthographic projection of the edge of the first opening on the display panel to the orthographic projection of the optical fingerprint sensor on the display panel is less than or equal to 1 mm.

12. The display module according to claim 1, wherein the orthographic projection of the edge of the third opening on the display panel and the orthographic projection of the edge of the first opening on the display panel substantially overlap.

13. The display module according to claim 1, further comprising:
a main control circuit board, wherein the optical fingerprint sensor is disposed on the main control circuit board, and the main control circuit board is connected to the display panel through the flexible circuit board.

14. The display module according to claim 1, further comprising:
a first electromagnetic shielding film disposed on a surface of the flexible circuit board proximate to the metal protective layer, the first electromagnetic shielding film being provided therein with a fourth opening at a position corresponding to the third opening; and/or
a second electromagnetic shielding film disposed on a surface of the flexible circuit board away from the metal protective layer, the second electromagnetic shielding film being provided therein with a fifth opening at a position corresponding to the third opening.

15. The display module according to claim 1, further comprising:
a protective cover plate disposed on a surface of the display panel away from the first protective layer.

16. A display device, comprising:
the display module according to claim 1.

17. The display module according to claim 1, wherein a shape and a size of the first opening are approximately same as a shape and a size of the fingerprint identification region, respectively.

18. A manufacturing method for a display module, the manufacturing method comprising:
providing a display panel, the display panel having a fingerprint identification region;
adhering a first protective layer having a first opening onto a back surface of the display panel, wherein the back surface is a surface of the display panel opposite to a display surface of the display panel, and the first opening of the first protective layer exposes the fingerprint identification region; and
adhering a metal protective layer having a second opening onto a surface of the first protective layer away from the display panel, wherein the second opening exposes the first opening, and an orthographic projection of an edge of the second opening on the display panel is located outside an orthographic projection of an edge of the first opening on the display panel;
wherein the display module further comprises a flexible circuit board disposed on a side of the metal protective layer away from the first protective layer, wherein the flexible circuit board is provided therein with a third opening, and an orthographic projection of an edge of the third opening on the display panel is located inside the orthographic projection of the edge of the second opening on the display panel; and
an optical fingerprint sensor disposed on a side of the flexible circuit board away from the metal protective layer, wherein an orthographic projection of the optical fingerprint sensor on the display panel is located inside the orthographic projection of the edge of the third opening on the display panel.

* * * * *